(12) United States Patent
Sel et al.

(10) Patent No.: US 9,153,595 B2
(45) Date of Patent: Oct. 6, 2015

(54) METHODS OF MAKING WORD LINES AND SELECT LINES IN NAND FLASH MEMORY (75) Inventors: Jongsun Sel, Los Gatos, CA (US); Tuan Pham, San Jose, CA (US); Kazuya Tokunaga, San Francisco, CA (US)

(73) Assignee: SanDisk Technologies Inc., Plano, TX (US)

( * ) Notice: Subject to any disclaimer, the term of this patent is extended or adjusted under 35 U.S.C. 154(b) by 518 days.

(21) Appl. No.: 13/619,553

(22) Filed: Sep. 14, 2012

(65) Prior Publication Data

US 2014/0078826 A1 Mar. 20, 2014

(51) Int. Cl.
G11C 16/04 (2006.01)
H01L 21/8239 (2006.01)
H01L 27/115 (2006.01)
H01L 27/02 (2006.01)

(52) U.S. Cl.
CPC .... H01L 27/11524 (2013.01); H01L 27/11519 (2013.01); *H01L 27/0207* (2013.01)

(58) Field of Classification Search
CPC .................. H01L 27/11524; H01L 27/11519
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,887,145 A | 3/1999 | Harari et al. | |
| 6,046,935 A | 4/2000 | Takeuchi et al. | |
| 7,495,294 B2 | 2/2009 | Higashitani | |
| 7,951,669 B2 | 5/2011 | Harari et al. | |
| 2007/0138535 A1 | 6/2007 | Higashitani | |
| 2007/0290232 A1 | 12/2007 | Nishiyama | |
| 2009/0154240 A1 | 6/2009 | Park et al. | |
| 2011/0318931 A1 | 12/2011 | Min et al. | |
| 2012/0156841 A1 | 6/2012 | Lee et al. | |

OTHER PUBLICATIONS

Notification of Transmittal of the International Search Report and the Written Opinion of the International Searching Authority, or the Declaration for Int'l Application No. PCT/US2013/057387 mailed Nov. 22, 2013, 12 pages.

*Primary Examiner* — Long Pham (74) *Attorney, Agent, or Firm* — Davis Wright Tremaine LLP (57) ABSTRACT

A NAND flash memory chip includes word lines formed by etching through concentric conductive loops and, in the same etch step, etching through a conductive strip to form select lines. A conductive loop forms two word lines which are in different erase blocks and are separately controlled by peripheral circuits.

13 Claims, 9 Drawing Sheets

METHODS OF MAKING WORD LINES AND SELECT LINES IN NAND FLASH MEMORY

BACKGROUND OF THE INVENTION

This invention relates generally to non-volatile semiconductor memories of the flash EEPROM (Electrically Erasable and Programmable Read Only Memory) type, their formation, structure and use, and specifically to methods of making word lines and select lines in NAND memory cell arrays.

Figure 1:
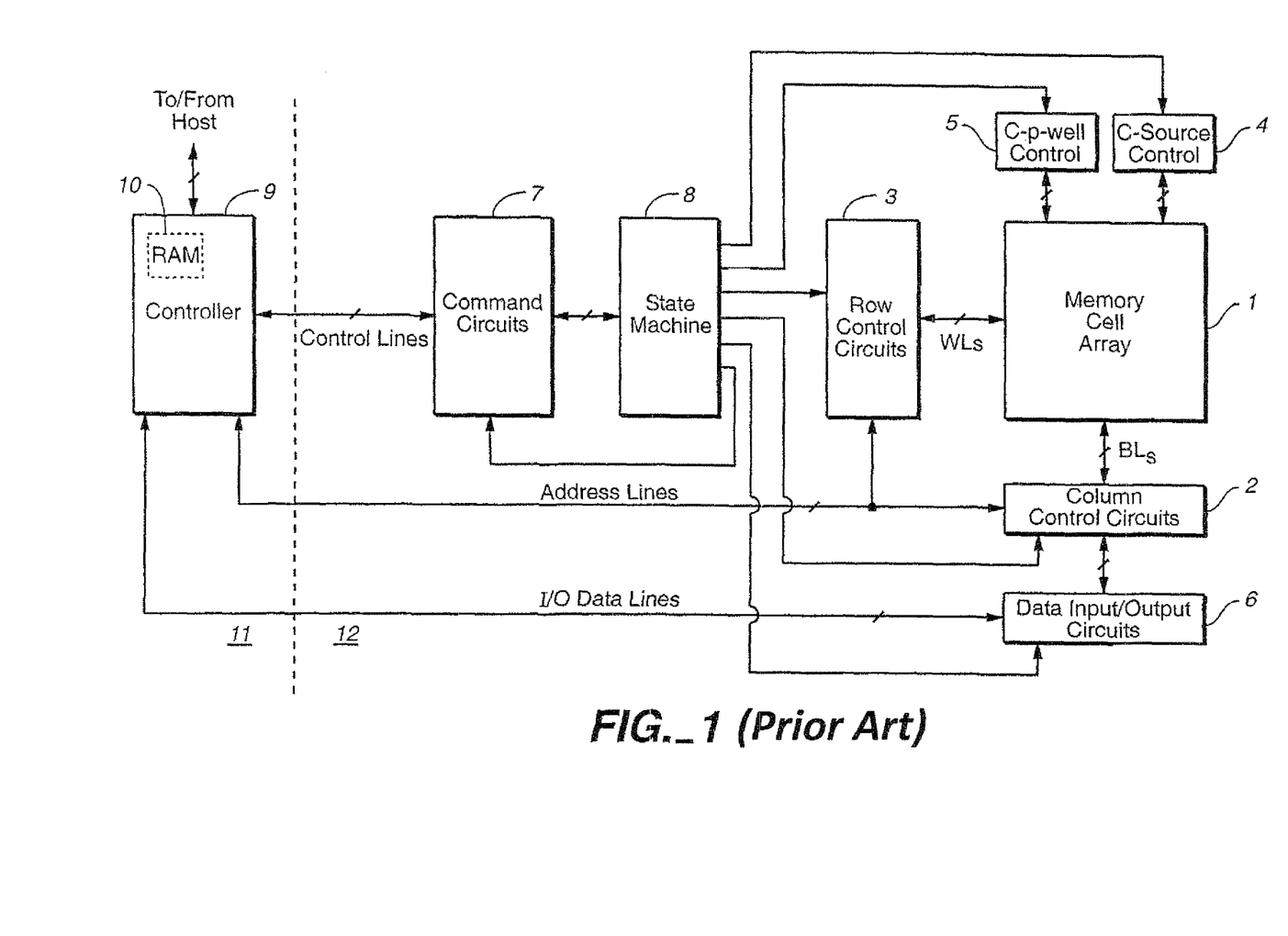
FIG. 1 is a block diagram of a prior art memory system.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

Figure 2A:
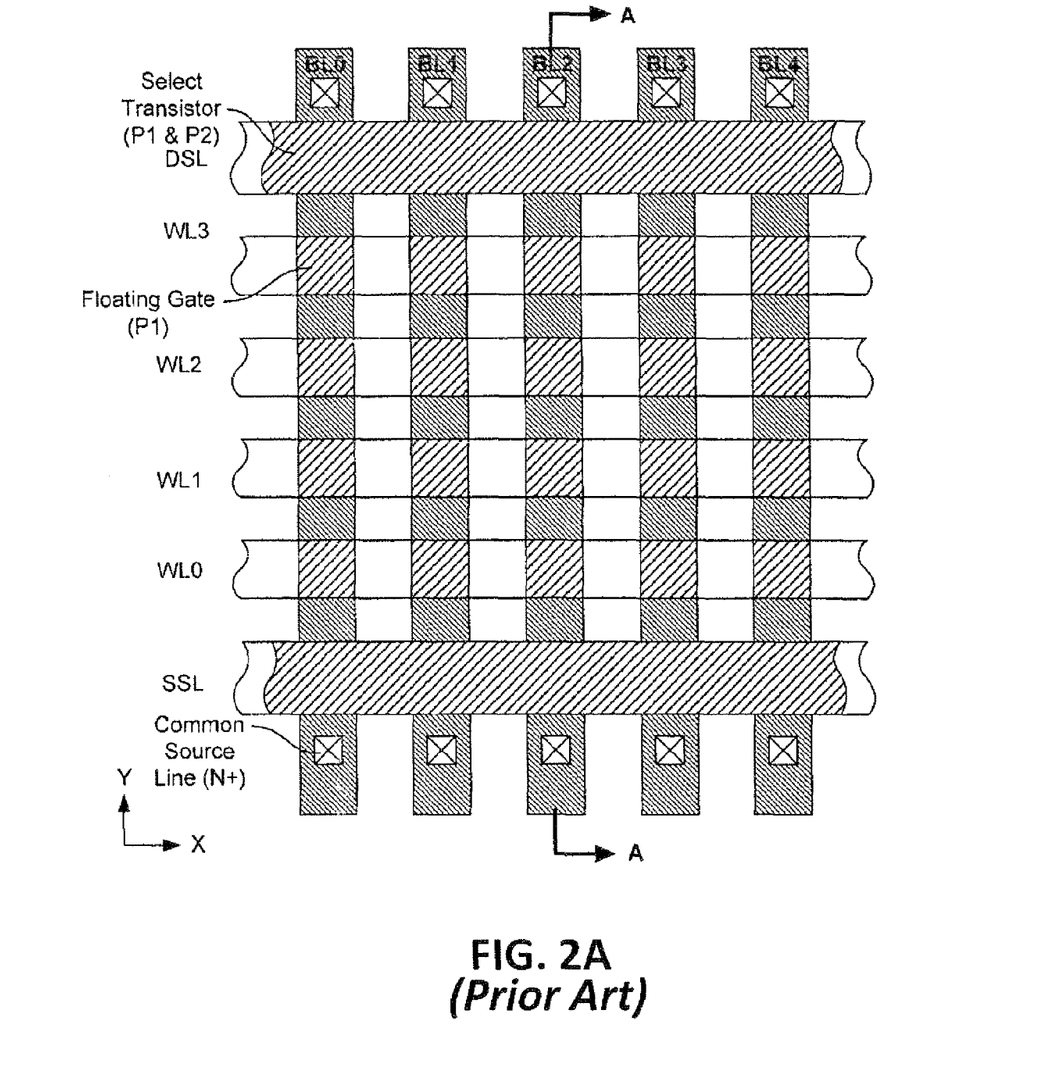
FIG. 2A is a plan view of a prior art NAND array.
Figure 2B:
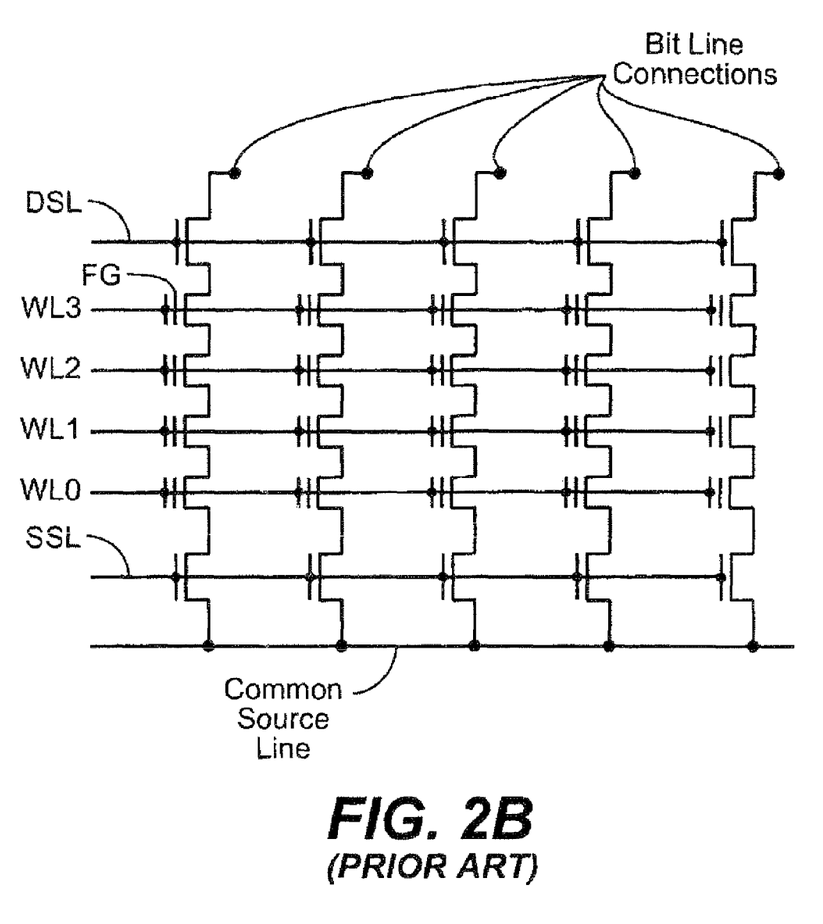
FIG. 2B is a circuit diagram for the prior art NAND array of FIG. 2A.

FIG. 2B is a circuit diagram for a portion of a NAND flash memory array such as shown in FIG. 2A. It can be seen that drain select line DSL controls select transistors at one end of NAND strings which connect to bit lines while source select line SSL controls the other end of NAND strings which connect to a common source line. It can be seen that select transistors have different functions and different structures to memory cells (e.g. select transistors have no floating gates). However, it is generally not desirable to use a different set of process steps for formation of select transistors and memory cells.

Thus, there is a need for a memory chip manufacturing process that forms the memory cells and select transistors in an efficient manner and there is a need for structures that can be formed accordingly.

SUMMARY OF THE INVENTION

According to an example, a NAND flash memory array is formed in an efficient manner by etching through conductive loops to form individual word lines (and underlying floating gates) and etching through conductive strips to form individual select lines in the same etch step. Conductive loops are arranged in a concentric arrangement with the conductive strips in a central area that is enclosed by the conductive loops. Thus, a single etched opening can extend across such an arrangement to form select lines in the central area and to divide conductive loops into word lines on either side.

An example of a method of forming a NAND flash memory array includes forming a plurality of concentric closed loops of a conductive material enclosing a central area; forming a continuous strip of the conductive material in the central area; dividing each of the plurality of concentric closed loops into two word lines using an etch step defined by a mask pattern; and dividing the continuous strip into separate select lines using the etch step defined by the mask pattern.

The mask pattern may define an opening extending across the continuous strip in the central area and across the plurality of concentric closed loops on either side of the central area. The opening may separate a first erase block of the NAND flash memory array from a second erase block of the NAND flash memory array. Additional concentric closed loops of the conductive material that enclose an additional central area may be divided in order to form additional word lines in the first erase block. An additional continuous strip may be divided in the additional central area to form additional select lines. NAND strings may extend from the select line to one of the additional select lines. Additional select lines may be formed that are not within a central area of a plurality of concentric closed loops. NAND strings of the first block may extend from a select line to one of the additional select lines. The plurality of concentric closed loops may form all of the word lines of the first block and all of the word lines of the second block.

An example of a method of foaming a NAND flash memory array includes performing a first etch step according to a first pattern to form closed loops of a conductive material and to form a strip of the conductive material; and subsequently performing a second etch step according to a second pattern to divide each closed loop into two separate word lines and to divide the strip into two separate select lines.

The two separate word lines may be formed in two separate erase blocks. The two separate select lines may be formed in two separate erase blocks. The second etch step according to the second pattern may also divide a portion of conductive material that is in contact with a closed loop into a first landing pad connected to a first word line and a second landing pad connected to a second word line.

An example of a NAND flash memory array includes a plurality of word lines extending in a first direction across a plurality of NAND strings, each of the plurality of word lines having a first end portion at a first end, the first end portion extending in a second direction that is perpendicular to the first direction and terminating at an opening, and having a second end portion at a second end, the second end portion extending in the second direction, the second end portion terminating at an opening.

The first end portion and the second end portion may terminate at the same opening. A first select line and a second select line may be defined by the opening. The NAND flash memory may also include an additional plurality of word lines extending in the first direction across the plurality of NAND strings, the additional plurality of word lines forming a pattern that is a mirror-image of a pattern formed by the first plurality of word lines. The plurality of word lines and the additional plurality of word lines may form an erase block.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

DETAILED DESCRIPTION OF EXEMPLARY EMBODIMENTS

Memory System

An example of a prior art memory system, which may be modified to include various aspects of the present invention, is illustrated by the block diagram of FIG. 1. A memory cell array I including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

A typical prior art NAND array includes control gate (word) lines extending across multiple strings over rows of floating gates with a suitable insulating dielectric layer in between. One control gate (word) line is used for each row of floating gates. In order to make an array with the floating and control gates self-aligned in a y-direction (along the lengths of the NAND strings), the same mask is generally used to form the control gates and to form the floating gates, which then have the same dimensions in the y-direction as the control gates. A single etch step may be used to form such control gate/floating gate stacks and to also define select gates.

Figure 3:
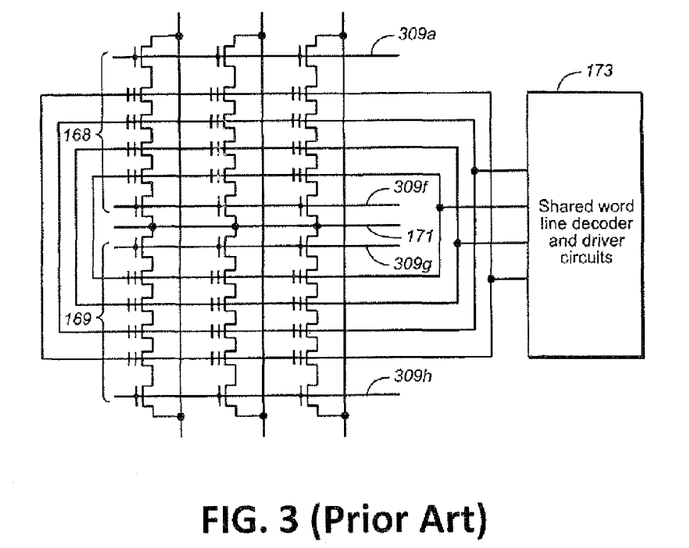
FIG. 3 is a circuit diagram for a prior art NAND.

In one design, described in U.S. Pat. No. 7,495,294, word lines may be formed by etching using a hard mask that is patterned to have critical dimensions that are less than the resolution of the lithographic process used. In particular, sidewalls are formed with very small lateral dimensions and these sidewalls are then used as mask portions to define word lines and underlying floating gates. Because such sidewalls are formed around the perimeter of forming structures, they are formed as closed loops. Such closed loops may be used to define two word lines that are connected together but are in different erase blocks (i.e. connect to different NAND strings above and below the central area as shown in FIG. 3). While the word lines of a loop are connected together and are thus controlled together (having the same voltage), the cells connected to a particular word line in a loop can be operated separately from the cells connected the other word line in the loop by using appropriate biasing of other components including select gate lines, and in some cases by using a shield plate as described in U.S. Pat. No. 7,495,294. FIG. 3 shows a circuit diagram for two erase blocks 168, 169, that contain word lines formed from a common set of conductive loops, and share a common source line 171 and word line decoder and driver circuits 173. Each erase block has its own select lines. Erase block 168 has drain select line 309a and source select line 309f. Erase block 169 has source select line 309g and drain select line 309h.

Figure 4A:
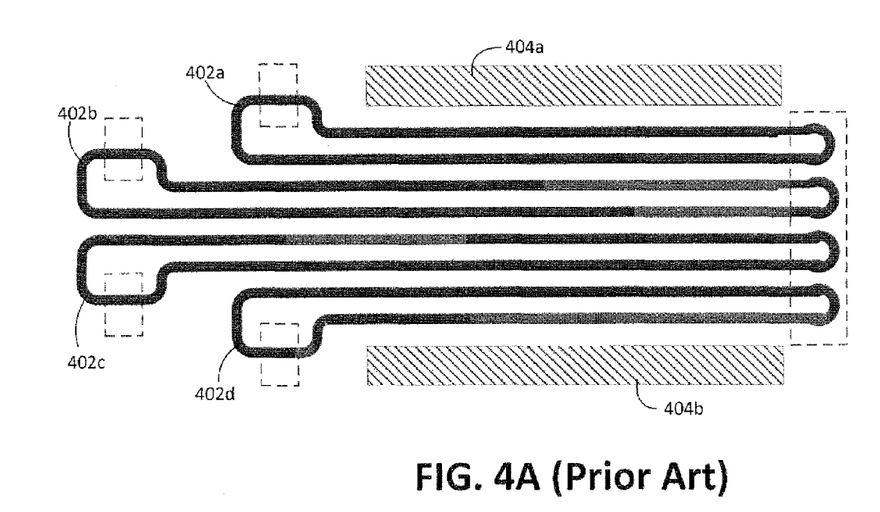
FIG. 4A illustrates formation of a prior art NAND array formed from parallel loops.
Figure 4B:
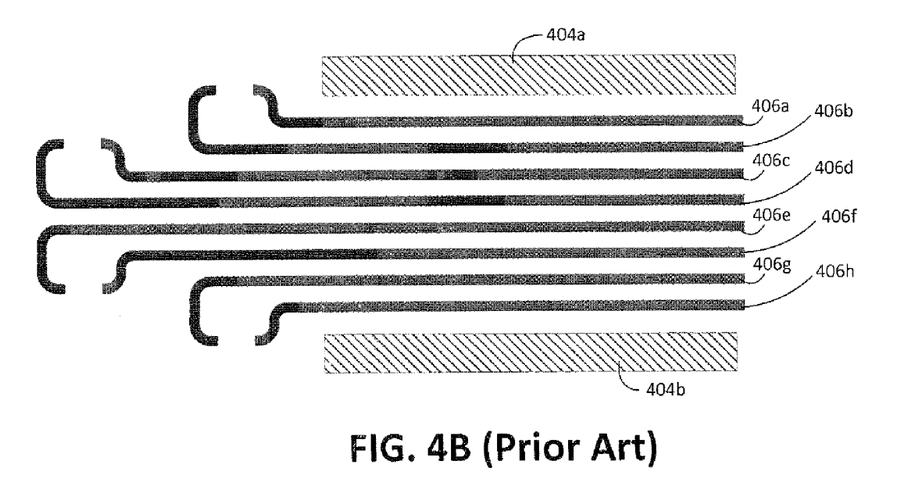
FIG. 4B shows the prior art NAND array of FIG. 4A after an etch step.

In another prior art arrangement, conductive loops formed from sidewalls may be arranged in a parallel arrangement instead of the concentric arrangement of FIG. 3A. An example of such a parallel arrangement is shown in FIGS. 4A-4B. A single loop is used to form two word lines in the same block in such an arrangement. The word lines are physically separated by etching through the loop at each end. Such physical separation allows separate control of the two word lines (i.e. they can have different voltages applied).

FIG. 4A shows a parallel loop design at an intermediate stage of fabrication where multiple loops 402a-402d of conductive material have been formed using sidewall mask portions. Strips of conductive material are also formed above and below the series of loops to form select lines 404a, 404b. Subsequently, an etch step is performed to remove the portions of the conductive material shown by the dashed lines so that each loop is divided into two word lines. At one end (the left side of FIG. 4A) loops open out to provide increased spacing between word lines so that electrical contact may be made to individual word lines without shorting to adjacent word lines.

The result of the etching step is shown in FIG. 4B which shows a series of word lines 406a-406h extending laterally between select lines 404a, 404b, and with word lines extending to the left of FIG. 4B so that there is adequate space to provide pads for vertical connection to the word lines. NAND strings extend between select lines 404a and 404b and are defined by Shallow Trench Isolation (STI) structures that are formed in the substrate (not shown in FIGS. 4A-4B for clarity).

In some cases, etching through conductive loops such as shown in FIG. 4A-4B may cause damage to delicate structures that have very small feature sizes. For example, a word line formed by a sidewall mask may be extremely narrow and have a high aspect ratio (it may be high compared to its width). Such structures are vulnerable to collapse during etching. Etching such structures has been found to be a significant cause of device failures.

According to an example of the present invention, word lines are formed from concentric loops of conductive material. These concentric loops are separated into individual word lines by an etch step. In this case, the etch step is the same etch step used to separate select lines so that the number of etch steps is kept low. The physical arrangement of concentric loops around a central area containing the select line structures supports performing a single etch step on both conductive loops and select line structures. In some cases, a single continuous opening may be etched through both the concentric loops and the select line structures, thus forming individual word lines and individual select lines.

Figure 5A:
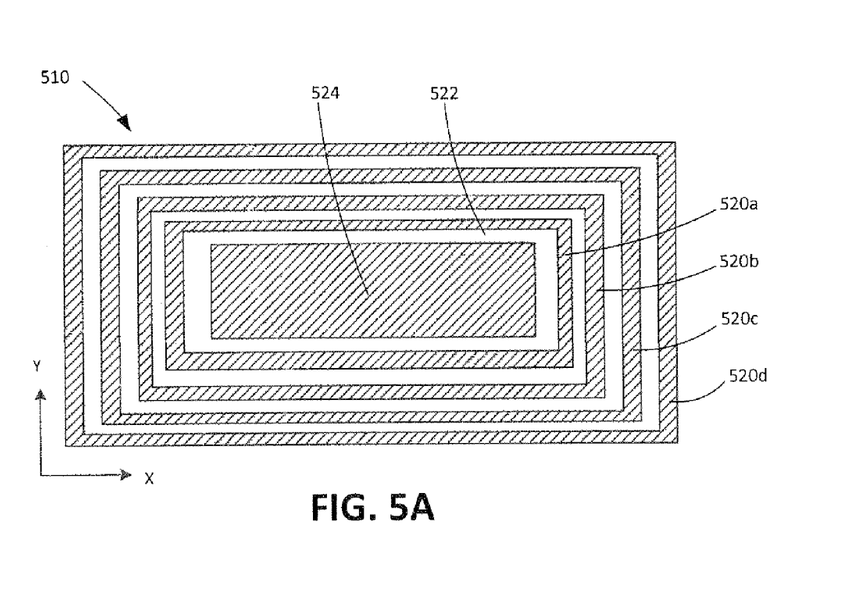
FIG. 5A shows a NAND array at an intermediate stage of fabrication.

FIG. 5A shows an example of an arrangement 510 that includes concentric loops 520a-d of conductive word line material formed by sidewalls, for example as described in U.S. Pat. No. 7,495,294. The concentric loops 520a-d enclose a central area 522. Within the central area is a select line structure 524 that is later formed into select lines. It will be understood that the conductive loops are formed from a layer in a stack of layers including not only word line material, but also portions of floating gate material in some locations, and inter-poly dielectric (IPD). Word line material may be any suitable conductive material such as doped polysilicon and/or metal. In one common arrangement, word lines are formed of a layer of doped (conductive) polysilicon with a metal layer (e.g. Tungsten, or Tungsten Silicide) formed over the polysilicon to provide low resistance. Floating gate material is typically doped polysilicon and may be referred to as "poly 1" while polysilicon used for word lines may be referred to as "poly 2." Select gate structures may include a similar stack of layers but with electrical contact between poly 1 and poly 2 layers so that no floating gate is formed (i.e. poly 1 is not electrically floating, but instead is connected to poly 2 to form a conventional gate).

While FIG. 5A shows an arrangement having four concentric loops enclosing a central area, it will be understood that a memory array may have many such arrangements in a repetitive pattern and that within each such arrangement there may be many concentric loops. The examples shown are for illustration and are simplified for clarity.

Figure 5B:
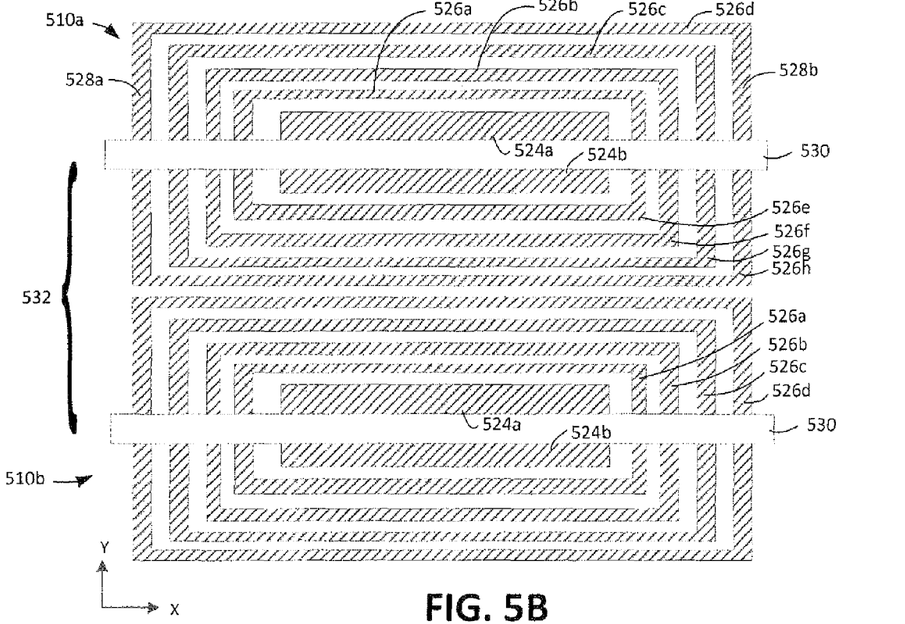
FIG. 5B shows the NAND array of FIG. 5A at a subsequent stage of fabrication.

FIG. 5B shows the two identical arrangements 510a, 510b, corresponding to arrangement 510 after patterning and etching to form openings 530 across the arrangements. In each arrangement, openings are formed that extend through select line structures 524 to form separate select lines 524a, 524b in central areas. The openings also extend through conductive loops to separate each conductive loop into two separate word lines 526a-h (e.g. separating conductive loop 520a into word lines 526a and 526e). Connections (not shown in FIG. 5B) may be made to the word lines and select lines so that they can be driven by circuits in the periphery. By forming individual word lines 526a-h and individual select lines 524a, 524b, in a single etch step as shown, the number of etch steps used is kept low.

The word lines thus formed have end portions on either side that extend at right angles to the main section of the word line (i.e. extend in the y-direction in FIG. 5B). The end portions terminate at etched openings. For example, end portions 528a and 528b of word line 526d extend along the y-direction (down, in FIG. 5B) to terminate at opening 530.

In FIG. 5B, select lines are formed by an etch step that also cuts through concentric loops that enclose the central area. NAND strings extend from a select line in one central area to a select line in another central area (central area of an adjacent concentric arrangement) for example, from select line 524b of arrangement 510a to select line 524a of 524a of arrangement 510b. Thus, where an erase block is formed from NAND strings sharing select lines and a common source line, the erase block is formed from portions of two different concentric arrangements. For example, half of the word lines in erase block 532 are from arrangement 510a and have end portions pointing one way. Half of the word lines are formed from arrangement 510b and have end portions pointing the opposite way (pointing up and down along y-direction in FIG. 5B). Put differently, conductive loops are cut into two word lines which are in two different blocks, not in the same block, in this design.

Figure 5C:
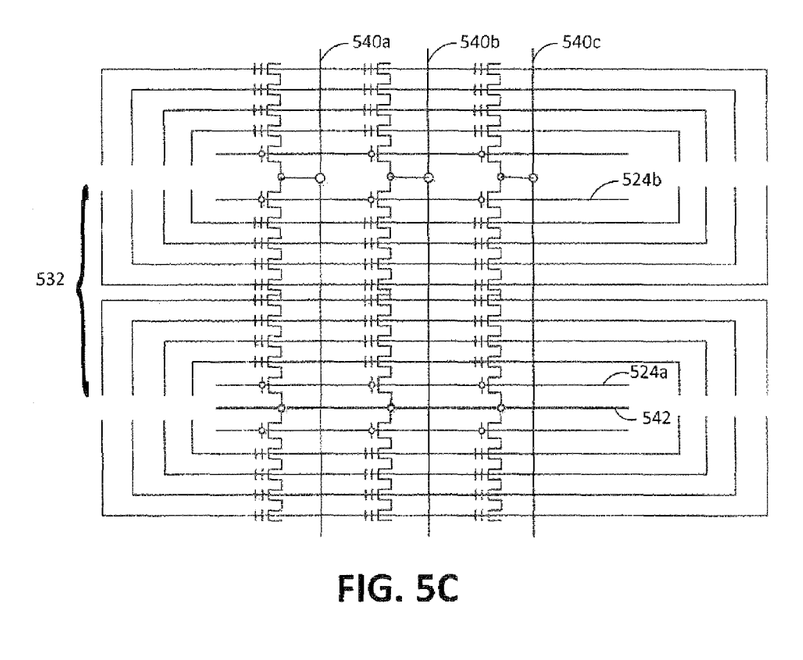
FIG. 5C is a circuit diagram for a NAND array formed as shown in FIGS. 5A and 5B.

FIG. 5C is a circuit diagram for a portion of a NAND flash memory array formed as described in FIGS. 5A-5B. FIG. 5C shows additional components formed after the stage shown in FIG. 5B (e.g. bit lines 540a-c, and common source lines 542), which may be formed in a conventional manner. Three NAND strings are shown in erase block 532 for clarity (a block may contain many NAND stings), with portions of NAND strings of adjacent blocks also shown. Common source line 542 connects the NAND strings of the block. The NAND stings of erase block 532 share source select line 524a and drain select line 524b. Connections are made to bit lines 540a-c at the drain side of erase block 532. While connections to word lines are not shown, it will be understood that each word line is connected to peripheral circuits in a suitable manner and can be individually controlled.

Figure 6A:
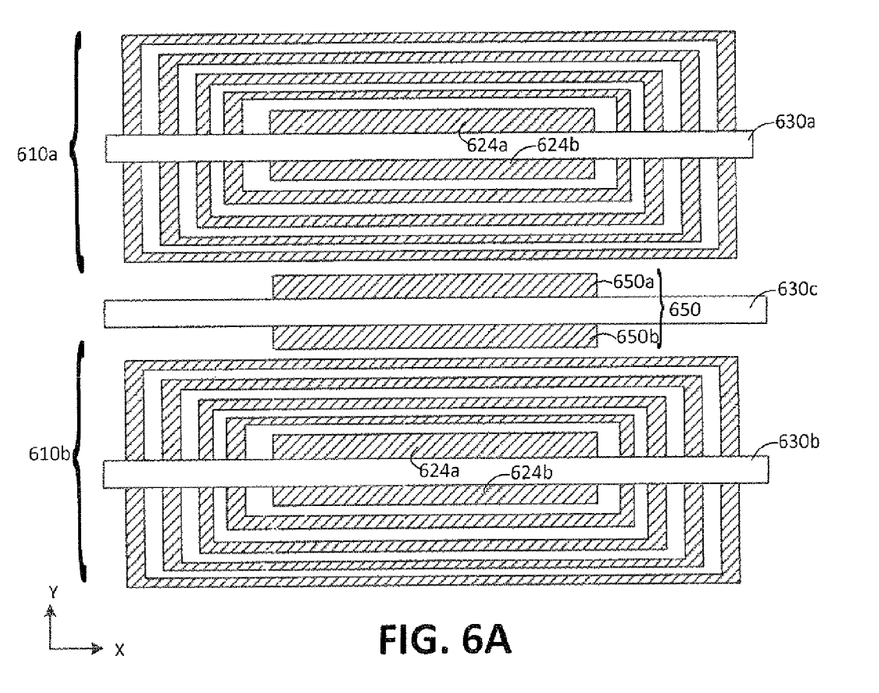
FIG. 6A shows another NAND array at an intermediate stage of fabrication.

FIG. 6A shows concentric arrangements 610a, 610b, that are similar to those of FIGS. 5A-5B, but with additional select line structures 650 between concentric arrangements (i.e. select line structures that do not have concentric loops around them). FIG. 6A shows all select line structures being divided into separate select lines by etched openings 630a-c that extend across the area shown. Openings 630a, 630b extend across central areas of concentric arrangements 610a, 610b to separate select lines and extend beyond the central areas to divide conductive loops into separate word lines. Opening 630c also forms separate select lines 650a, 650b between concentric arrangements 610a, 610b. Thus, there are two kinds of select lines in this layout, select lines 624a, 624b formed in central areas of concentric arrangements and select lines 650a, 650b formed between concentric arrangements.

NAND stings extend from one select line, across multiple word lines, to another select line. In FIG. 6A this means that NAND strings are formed from a select line formed in a central opening of a concentric arrangement (e.g. select line 624b in arrangement 610a) to a select line between concentric arrangements (e.g. select line 650a between arrangements 610a and 610b). Thus, any given NAND sting extends across only word lines formed from half of a concentric arrangement.

Figure 6B:
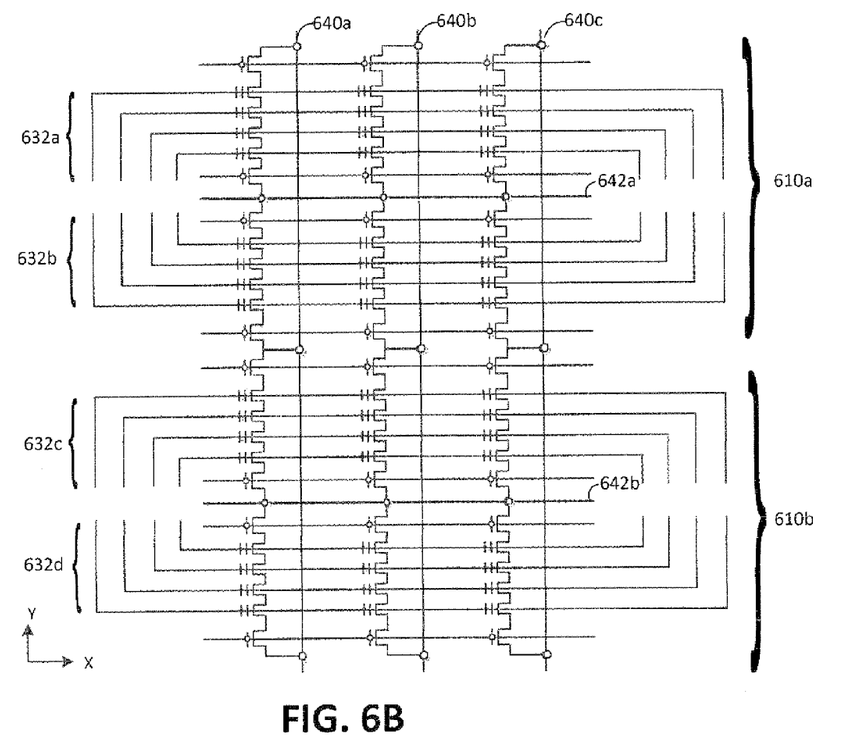
FIG. 6B is a circuit diagram for a NAND array formed as shown in FIG. 6A.

FIG. 6B is a circuit diagram for a portion of a NAND array formed as shown in 6A, with additional components such as bit lines 640a-c and common source lines 642a, 642b. Connections to bit lines 640a-c are formed between concentric arrangements 610a and 610b in this example, and connections to common source lines 642a, 642b are formed in central areas of concentric arrangements 610a, 610b respectively. However, in other examples these connections may be made in a different manner (e.g. bit line connections in central areas and common source line connections between concentric arrangements). It can be seen that four erase blocks 632a-d are formed from the two concentric arrangements 610a, 610b in FIG. 6B, with the word lines of a particular block being formed from half of a concentric arrangement. Blocks alternate along the y-direction, with end portions of word lines all pointing the same way in a given block, alternating between pointing up and down. Each block thus has a pattern that is a mirror image of the pattern of its neighbor.

Figure 7:
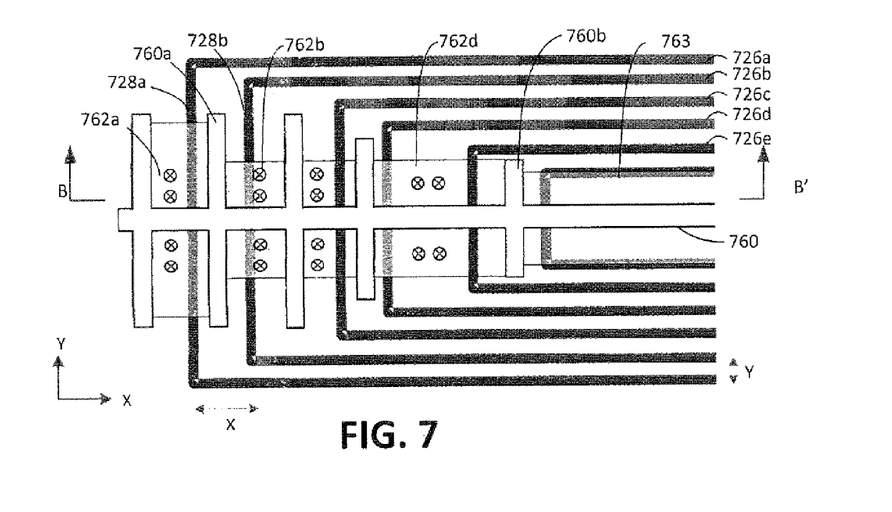
FIG. 7 shows an etch dividing loops into separate word lines in a NAND array.

While the above description shows an etch step forming a simple rectangular opening extending across concentric arrangements, openings may be of any suitable shape and may additionally define landing pads used to connect word lines to control circuits. FIG. 7 shows an example of an opening 760 that extends across a concentric arrangement to intersect conductive loops at right angles and divide them in two. Opening 760 also extends between end portions of the conductive loops, parallel to the end portions, in order to isolate landing pads that are used to contact the word lines. For example, opening 760 includes a portion 760a that extends between end portion 728a and end portion 728b of word lines 726a and 726b respectively. This separates landing pads 762a of word line 726a and landing pad 762b of word line 726b. While opening 760 is a single continuous opening, in other examples, two or more openings may be used to divide conductive loops and select gate structures and to separate landing pads.

Opening 760 also separates select line 763 from the landing pads. FIG. 7 shows that opening 760 includes a portion 760b that extends between select line 763 and adjacent landing pad 762d. While landing pad 762d is connected to two word lines 726d, 726e, which act as dummy word lines, in other examples there may be no dummy word lines and active word lines may be adjacent to the select line. In other examples, separation of select gates and landing pads is provided by a different patterning step and is not done by the same step used to divide conductive loops into separate word lines.

It will be understood that spacing between word lines can be extremely small where sidewall masking is used to make features smaller than the resolution of the photolithographic process. This presents certain difficulties when connecting to such word lines. In order to provide adequate space for connections, word lines may be spaced further apart in areas where contacts are to be formed than they are where memory cells are to be formed. FIG. 7 shows word lines that are spaced apart a distance Y in the y-direction where memory cells are formed. These word lines are spaced apart a distance X in the x-direction in areas where contacts are to be formed. X is generally some dimension that is somewhat greater than the resolution of the lithographic process used. Opening portion 760a, which is formed by patterning, and may have dimensions greater than or equal to the minimum resolvable dimension of the lithographic process used, fits within the space X between word lines.

Landing pads may be used to ensure good contact and provide better tolerance for misalignment where contact is to be made with word lines. Landing pads such as 762a, 762b may be formed by placing additional mask portions over sidewall mask portions, so that an extended conductive area is formed when etching to form conductive loops. Alternatively, some additional conductive material may be deposited to form an extended conductive area. One or more openings divide such an extended conductive area into individual landing pads. Such openings may be the same openings used to divide conductive loops and select gate structures. Thus, individual landing pads may be formed by the same etch step that forms individual word lines and individual select lines thus keeping the number of etch steps low.

Figure 8A:
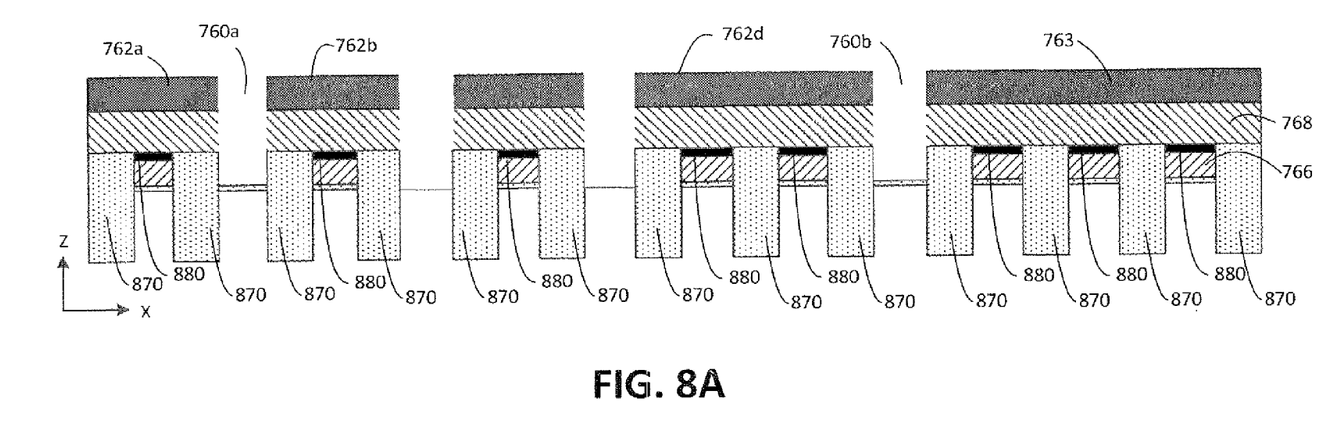
FIG. 8A shows the structure of FIG. 7 in cross-sectional view.

FIG. 8A shows a cross section along B-B' in FIG. 7 including landing pads 762a, 762b, 762d, select gate 763, and opening portions 760a, 760b. STI structures 870 are shown under the select line 763 where they isolate NAND strings from their neighbors (STI structures extend in the y-direction, perpendicular to the cross-section shown). STI structures 870 are also shown under landing pads 762a-d in FIG. 8A although in some examples STI structures may not be present in this area. Poly 1 766 and poly 2 768 are in contact in the select line so that no floating gates are formed at these locations. Some IPD material may be removed to provide this contact, for example by etching an opening through the middle of a portion of IPD in a select transistor while leaving IPD at the sides of the select transistor. The cross section of FIG. 8A is close to the side of the select transistors formed by opening 760 and therefore shows portions of IPD 880 at this location, not an opening. FIG. 8A also shows portions of IPD 880 between poly 1 and poly 2 in landing pads.

Figure 8B:
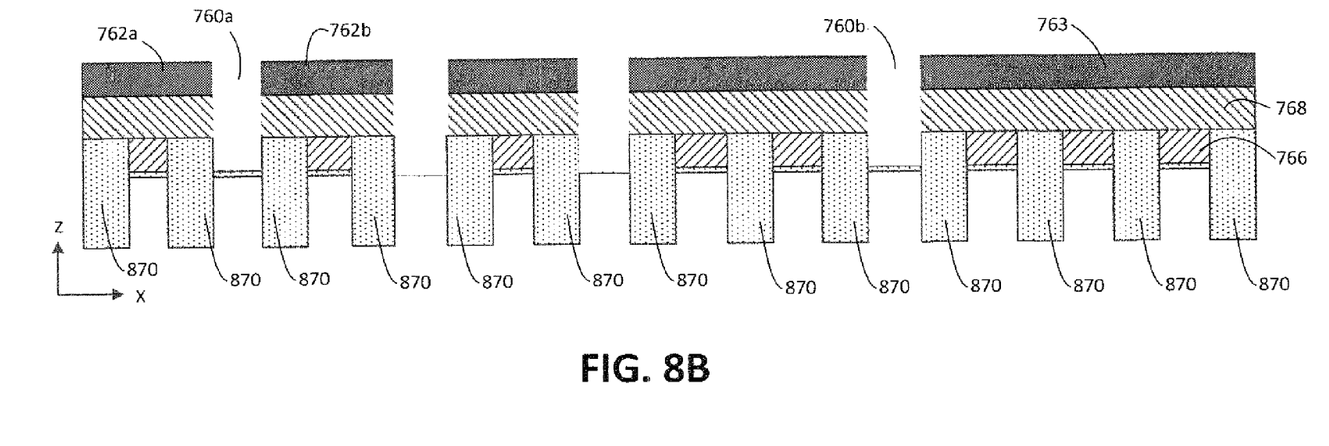
FIG. 8B shows a cross-sectional view where wide openings are formed in the IPD.

In some cases, wide openings may be formed in the IPD layer where select gates are to be formed. Examples of such wide openings are described in U.S. patent application Ser. No. 13/592,780, entitled "Structures and methods of making NAND flash memory", filed on Aug. 23, 2012, and incorporated by reference in its entirety. Where the opening of FIG. 7 passes through such a wide IPD opening, no IPD may be present so that the stack of layers that is etched does not contain any IPD at this location as shown in FIG. 8B, which is the same view as in FIG. 8A where a wide opening in the IPD extends to opening 760. In some cases poly 2 is also entirely removed in wide openings and so may not be present in a cross section. Accordingly, it may be desirable to remove all IPD (and in some cases, poly 2) from concentric loops where they are to be divided by the same etch so that these structures etch similarly (without under etching or over etching). Thus, the pattern used to define wide openings may extend to include the concentric loops on either side of the central area (in addition to the central area and certain peripheral areas) so that a similar stack is etched at all locations. In other examples, IPD may remain along the side of select lines where they are etched while being removed from concentric rings, or may remain in concentric rings while being removed from sides of select lines.

Conclusion

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of forming a NAND flash memory array comprising:
    forming a plurality of concentric closed loops of a conductive material enclosing a central area;
    forming a continuous strip of the conductive material in the central area;
    dividing each of the plurality of concentric closed loops into two word lines using an etch step defined by a mask pattern; and
    dividing the continuous strip into separate select lines using the etch step defined by the mask pattern.

2. The method of claim 1 wherein the mask pattern defines an opening extending across the continuous strip in the central area and across the plurality of concentric closed loops on either side of the central area.

3. The method of claim 2 wherein the opening separates a first erase block of the NAND flash memory array from a second erase block of the NAND flash memory array.

4. The method of claim 3 further comprising dividing additional concentric closed loops of the conductive material that enclose an additional central area in order to form additional word lines in the first erase block.

5. The method of claim 4 further comprising dividing an additional continuous strip in the additional central area to form additional select lines.

6. The method of claim 5 wherein NAND strings extend from the select line to one of the additional select lines.

7. The method of claim 3 further comprising forming additional select lines that are not within a central area of a plurality of concentric closed loops.

8. The method of claim 7 wherein NAND strings of the first block extend from a select line to one of the additional select lines.

9. The method of claim 8 wherein the plurality of concentric closed loops forms all of the word lines of the first block and all of the word lines of the second block.

10. A method of forming a NAND flash memory array comprising:
    performing a first etch step according to a first pattern to form closed loops of a conductive material and to form a strip of the conductive material; and
    subsequently performing a second etch step according to a second pattern to divide each closed loop into two separate word lines and to divide the strip into two separate select lines.

11. The method of claim 10 wherein the two separate word lines are formed in two separate erase blocks.

12. The method of claim 10 wherein the two separate select lines are formed in two separate erase blocks.

13. The method of claim 10 further comprising using the second etch step according to the second pattern to divide a portion of conductive material that is in contact with a closed loop into a first landing pad connected to a first word line and a second landing pad connected to a second word line.

* * * * *